(12) United States Patent
Sakuma et al.

(10) Patent No.: US 7,998,766 B2
(45) Date of Patent: Aug. 16, 2011

(54) SEMICONDUCTOR ELEMENT AND MANUFACTURING METHOD THEREOF

(75) Inventors: Yasushi Sakuma, Tokyo (JP); Daisuke Nakai, Yokohama (JP); Shigenori Hayakawa, Atsugi (JP); Kazuhiro Komatsu, Yokohama (JP)

(73) Assignee: OpNext Japan, Inc., Kanagawa (JP)

( * ) Notice: Subject to any disclaimer, the term of this patent is extended or adjusted under 35 U.S.C. 154(b) by 574 days.

(21) Appl. No.: 12/108,553

(22) Filed: Apr. 24, 2008

(65) Prior Publication Data

US 2009/0065901 A1   Mar. 12, 2009

(30) Foreign Application Priority Data

Sep. 10, 2007  (JP) .................................. 2007-234143

(51) Int. Cl.
*H01L 21/00* (2006.01)
(52) U.S. Cl. ................ 438/29; 438/31; 438/32
(58) Field of Classification Search .................... 438/29, 438/31–32
See application file for complete search history.

(56) References Cited

U.S. PATENT DOCUMENTS

| | | | |
|---|---|---|---|
| 6,865,204 B2* | 3/2005 | Matsuyama et al. | 372/46.01 |
| 6,993,233 B2* | 1/2006 | Shimizu et al. | 385/129 |
| 7,279,349 B2* | 10/2007 | Sakuma et al. | 438/31 |
| 7,330,622 B2* | 2/2008 | Shimizu et al. | 385/129 |
| 7,593,445 B2* | 9/2009 | Sasada et al. | 372/50.11 |
| 2005/0018989 A1* | 1/2005 | Shimizu et al. | 385/129 |
| 2005/0286828 A1* | 12/2005 | Sakuma et al. | 385/14 |
| 2006/0008224 A1* | 1/2006 | Shimizu et al. | 385/129 |
| 2007/0297475 A1* | 12/2007 | Sasada et al. | 372/44.01 |
| 2008/0020502 A1* | 1/2008 | Shiga et al. | 438/31 |
| 2009/0065901 A1* | 3/2009 | Sakuma et al. | 257/618 |

FOREIGN PATENT DOCUMENTS

| | | | |
|---|---|---|---|
| JP | 10026710 A | * | 1/1998 |
| JP | 2005175382 A | * | 6/2005 |
| JP | 2006-351818 | | 12/2006 |
| JP | 2009070835 A | * | 4/2009 |

* cited by examiner

*Primary Examiner* — Laura M Menz
(74) *Attorney, Agent, or Firm* — Antonelli, Terry, Stout & Kraus, LLP.

(57) ABSTRACT

A semiconductor element and a manufacturing method of the semiconductor element are provided. A ridge waveguide type semiconductor integrated element includes: an electrode of an EA portion and an electrode of an LD portion which are arranged so as to be away from each other; a contact layer of the EA portion and a contact layer of the LD portion which are arranged so as to be away from each other and in each of which the electrode is formed on an upper surface and an edge of at least a part of the upper surface is set to the same electric potential as that of the electrode; a passivation film as an insulative concave/convex structure extending from an edge of one of the two contact layers to an edge of the other contact layer; and a polyimide resin for embedding the passivation film.

2 Claims, 5 Drawing Sheets

FIG.6A
FIG.6B
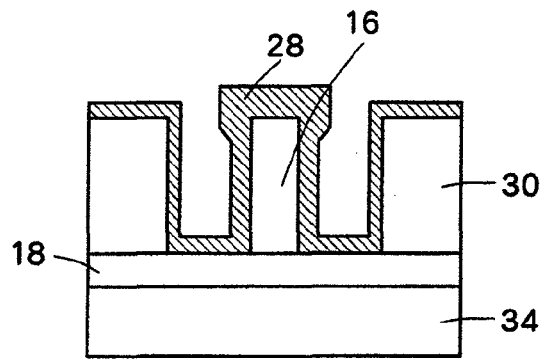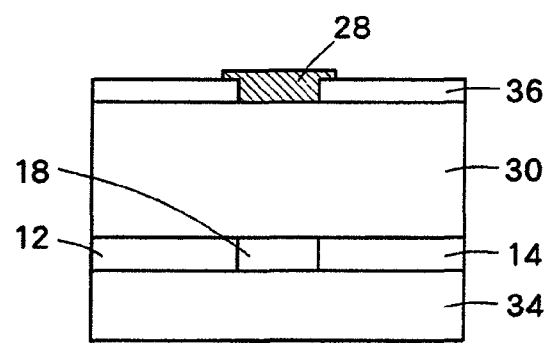
FIG.7A
FIG.7B
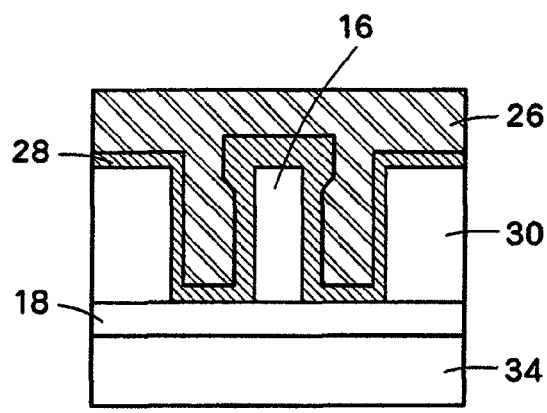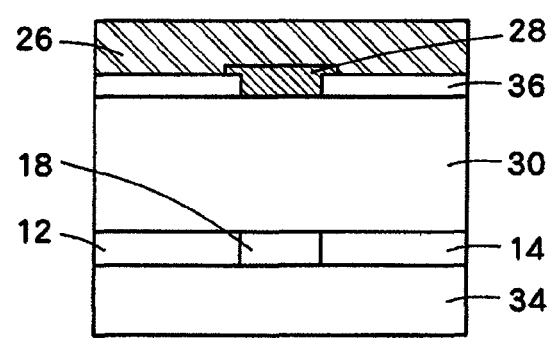
FIG.8A
FIG.8B
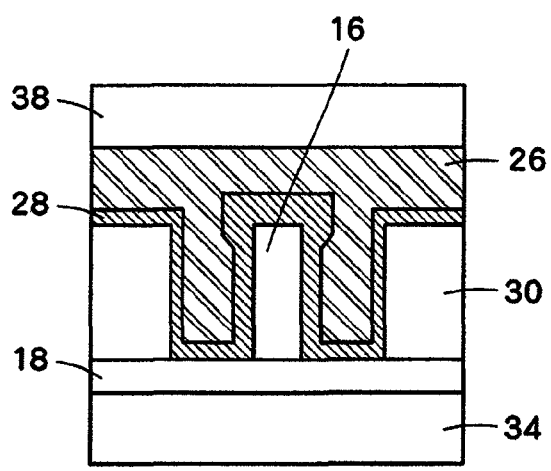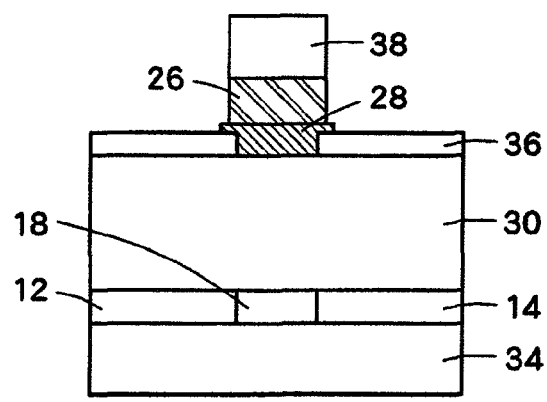

- 60
- 64
- 52 : EA PORTION
- a—a' 58 : SEPARATING PORTION
- 62
- 54 : LD PORTION
- 56 : WAVEGUIDE
- 50

AFTER THE EVAPORATION DEPOSITION OF THE ELECTRODE MATERIAL

AFTER THE ION MILLING

REMAINING ELECTRODE

SEMICONDUCTOR ELEMENT AND MANUFACTURING METHOD THEREOF

INCORPORATION BY REFERENCE

The present application claims priority from Japanese application JP2007-234143 filed on Sep. 10, 2007, the content of which is hereby incorporated by reference into this application.

BACKGROUND OF THE INVENTION

1. Field of the Invention

The invention relates to a semiconductor element and a manufacturing method thereof and, more particularly, to a technique for electrically separating two electrodes.

2. Description of the Related Arts

A semiconductor laser whose response speed is raised by unitedly integrating an intensity modulator and a laser diode has been known. For example, a semiconductor integrated element of a ridge waveguide type including an EA (Electro-Absorption type) modulator, a DFB (Distributed Feedback type) laser, and a ridge type optical waveguide connecting them has been disclosed in JP-A-2006-351818.

As shown in FIG. 12, an electrode 60 of an EA modulator (hereinbelow, referred to as "EA portion") 52 and an electrode 62 of a laser (hereinbelow, referred to as "LD portion") 54 are formed on the surface of a semiconductor integrated element 50 of the ridge waveguide type, respectively. The electrodes 60 and 62 are formed by the following steps. First, a passivation film (for example, $SiO_2$ film) for surface protection is formed on the whole surface of a wafer. Further, an electrode material (for example, Au) is evaporation-deposited on the passivation film. Finally, areas other than areas which become the electrodes in formed electrode layers are removed by dry etching having an orientation, thereby forming the electrode 60 of the EA portion 52 and the electrode 62 of the LD portion 54.

However, the ridge waveguide type semiconductor integrated element which is manufactured by the foregoing steps in the related has the following factors of deteriorating a manufacturing yield.

FIGS. 13A and 13B are cross sectional views of the ridge waveguide type semiconductor integrated element 50 taken along the line a-a' in FIG. 12. FIG. 13A shows a cross sectional structure after the electrodes were evaporation-deposited. FIG. 13B shows a cross sectional structure after an electrode pattern was formed. Since passivation films 68 serving as insulating films (protecting films) are isotropically formed on an upper surface and a side surface of a waveguide 56 by a CVD (Chemical Vapor Deposition), in an upper periphery 74 of the waveguide 56, a thickness of passivation film 68 is thicker than those of the other portions as shown in FIG. 13A.

According to the foregoing manufacturing method in the related art, since the electrode material is directly evaporation-deposited onto the passivation film 68, if a dry etching having an orientation such as ion milling or the like is used to form the electrode pattern, as shown in FIG. 13B, in a side wall of the waveguide 56, a portion where the thickness of passivation film 68 changes becomes a shadow of an ion beam and there is a case where an electrode layer 66 formed in such a portion is not perfectly removed. Similarly, there is also a case where in bottom corner portions of grooves formed on both sides of the waveguide, a part of the electrode layer 66 is not removed but remains.

That is, according to the ridge waveguide type semiconductor integrated element 50, since the EA portion 52 and the LD portion 54 are coupled by the groove formed by concave/convex-shaped insulating walls along the waveguide 56 of the ridge type, if the electrode material is directly evaporation-deposited onto a groove portion of a separating portion 58 for separating the EA portion 52 and the LD portion 54 in accordance with the manufacturing steps in the related art, there is a case where in the concave/convex-shaped insulating walls which form the grooves, the electrode layer 66 formed in the portion which becomes the shadow of the ion milling or the like is not perfectly removed. There are, consequently, such problems that a separation resistance of the electrode 60 of the EA portion 52 and the electrode 62 of the LD portion 54 decreases, the response speed of the semiconductor laser decreases, and the manufacturing yield deteriorates.

SUMMARY OF THE INVENTION

The invention is made in consideration of the foregoing problems in the related arts and it is an object of the invention to provide a semiconductor element in which two electrodes can be electrically and perfectly separated and a manufacturing method of the semiconductor element.

To solve the above problems, according to the invention, there is provided a manufacturing method of a semiconductor element, comprising the steps of: forming onto a substrate a concave- or convex-shaped concave/convex structure having insulation performance and extending from one of two electrode conducting areas having same electric potentials as those of two electrodes arranged so as to be away from each other to the other electrode conducting area; embedding the concave/convex structure by an insulating material; forming an electrode layer into at least areas where the electrodes are formed onto the substrate in which the concave/convex structure has been embedded by the insulating material; and removing areas other than the areas which become the electrodes in the electrode layer by predetermined electrode removing means having an orientation.

The predetermined electrode removing means having the orientation is means for removing an object to be processed by particles which are emitted in a predetermined direction and, for example, a dry etching such as an ion milling or the like corresponds to such means.

According to the invention, since the step of embedding the concave/convex structure extending from one of the two electrode conducting areas to the other by the insulating material is executed before the electrode layer is formed, the electrode layer is not directly formed onto the concave/convex structure. Therefore, the portion which becomes the shadow of the predetermined electrode removing means having the orientation is not caused between the two electrode conducting areas. The electrode layer formed in the area other than the areas which become the electrodes can be perfectly removed by the electrode removing means. That is, the two electrodes are electrically and perfectly separated.

According to an embodiment of the invention, in the step of embedding the concave/convex structure by the insulating material, the insulating material is swollen higher than the electrode conducting areas and, between the two electrode conducting areas, the insulating material is extended from one end of the semiconductor element to the other end. According to the embodiment, between the two electrode conducting areas, the insulating material is extended from one end of the semiconductor element to the other end, in other words, the insulating material is extended without a break from one end to the other end of the semiconductor element. Therefore, a new concave/convex structure extending from one of the two electrode conducting areas to the other is not formed by the swelling of the insulating material. Therefore, even if the insulating material is swollen higher than the electrode conducting areas, the two electrodes are electrically and perfectly separated.

According to the embodiment of the invention, the semiconductor element is a ridge waveguide type semiconductor integrated element obtained by integrating an optical modulator and a laser diode, wherein the concave/convex structure is formed along a shape of a ridge type optical waveguide coupling the optical modulator and the laser diode, and the electrodes are formed in at least a part of an upper surface of a contact layer of the optical modulator and in at least a part of an upper surface of a contact layer of the laser diode, respectively. According to the embodiment, in the ridge waveguide type semiconductor integrated element, the electrode of the optical modulator and the electrode of the laser diode can be electrically and perfectly separated.

In the manufacturing method of the semiconductor element, the predetermined electrode removing means may be the ion milling and the insulating material may be a polyimide resin.

According to the invention, there is provided a semiconductor element comprising: two electrodes arranged so as to be away from each other; two bases which are arranged so as to be away from each other and in each of which the electrode is formed on an upper surface and an edge of at least a part of the upper surface is set to the same electric potential as that of the electrode; a concave-or convex-shaped concave/convex structure having insulation performance and extending from the edge of one of the two bases to the edge of the other base; and an insulating portion which embeds the concave/convex structure.

According to the embodiment of the invention, the insulating portion is swollen higher than the bases and, between the bases, the insulating portion is extended from one end to the other end of the semiconductor element.

Other objects, features and advantages of the invention will become apparent from the following description of the embodiments of the invention taken in conjunction with the accompanying drawings.

BRIEF DESCRIPTION OF THE DRAWINGS

FIG. 6A is a diagram for explaining a manufacturing step (removal of a resist) of the ridge waveguide type semiconductor integrated element according to the embodiment of the invention;

FIG. 6B is a diagram for explaining a manufacturing step (removal of the resist) of the ridge waveguide type semiconductor integrated element according to the embodiment of the invention;

FIG. 7A is a diagram for explaining a manufacturing step (coating with polyimide) of the ridge waveguide type semiconductor integrated element according to the embodiment of the invention;

FIG. 7B is a diagram for explaining a manufacturing step (coating with polyimide) of the ridge waveguide type semiconductor integrated element according to the embodiment of the invention;

FIG. 8A is a diagram for explaining a manufacturing step (removal of polyimide) of the ridge waveguide type semiconductor integrated element according to the embodiment of the invention;

FIG. 8B is a diagram for explaining a manufacturing step (removal of polyimide) of the ridge waveguide type semiconductor integrated element according to the embodiment of the invention;

DESCRIPTION OF THE INVENTION

An embodiment of the invention will be described in detail hereinbelow with reference to the drawings.

Figure 1:
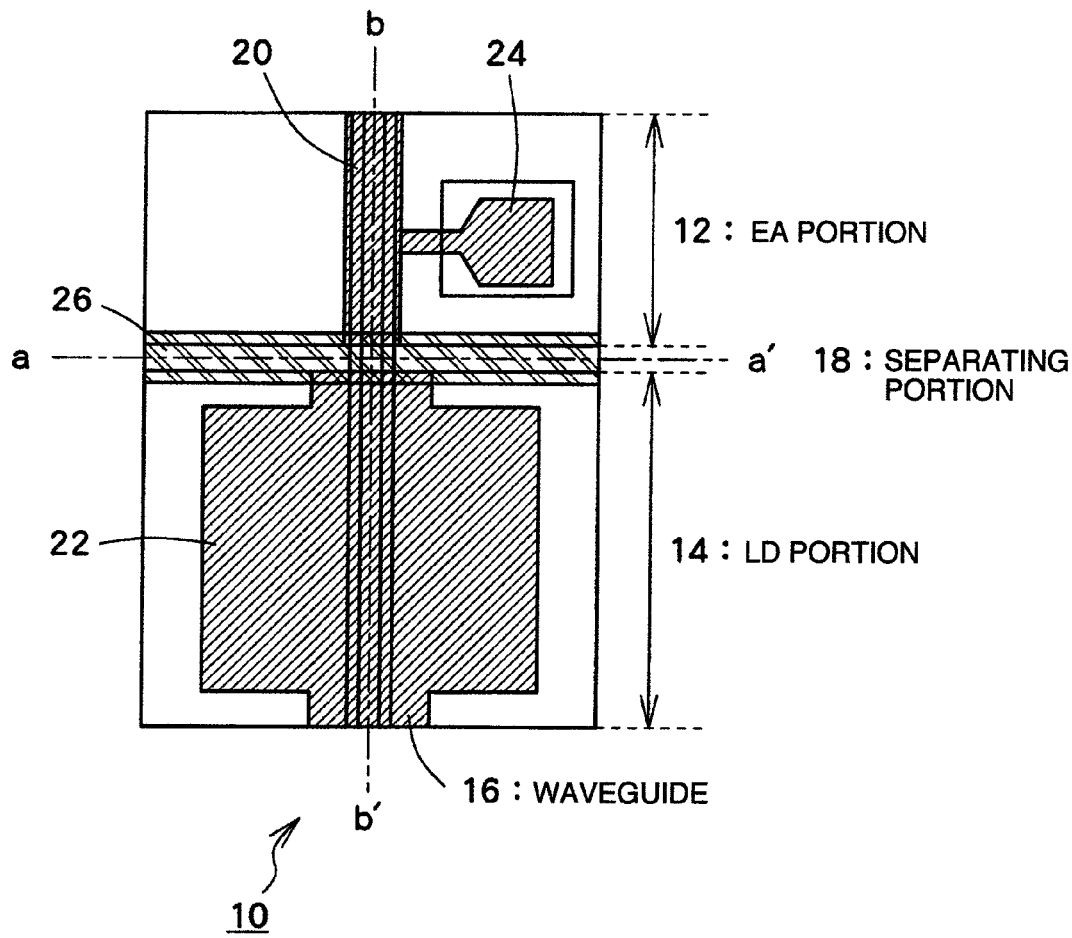
FIG. 1 is a top view of a ridge waveguide type semiconductor integrated element according to an embodiment of the invention.
Figure 2A:
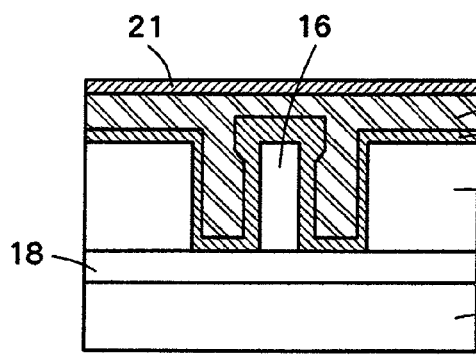
FIG. 2A is a cross sectional view of the ridge waveguide type semiconductor integrated element taken along the line a-a' in FIG. 1.
Figure 2B:
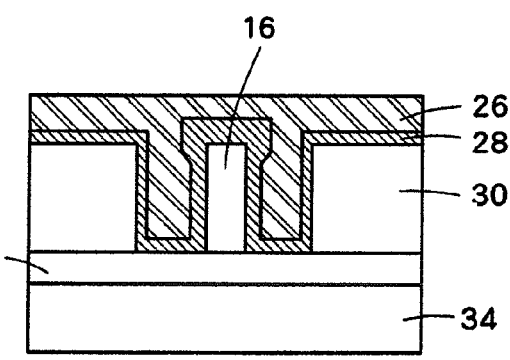
FIG. 2B is a cross sectional view of the ridge waveguide type semiconductor integrated element taken along the line a-a' in FIG. 1.

FIG. 1 is a top view of a ridge waveguide type semiconductor integrated element 10 according to the embodiment of the invention. FIGS. 2A and 2B are cross sectional views of the ridge waveguide type semiconductor integrated element 10 taken along the line a-a' in FIG. 1.

As shown in FIG. 1, the ridge waveguide type semiconductor integrated element 10 includes: an EA modulator (EA portion) 12; a laser diode(LD portion)14; a ridge type waveguide 16 which couples the EA portion 12 and the LD portion 14; and a separating portion 18 for separating the EA portion 12 and the LD portion 14. The ridge waveguide type semiconductor integrated element 10 is constructed in such a manner that a laser beam emitted from the LD portion 14 enters the EA portion 12 through the waveguide 16, is modulated in the EA portion 12 by an Electro-Absorption effect, and thereafter, is outputted to the outside.

An electrode 20 and an electrode pad (PAD portion) 24 of the EA portion 12, an electrode 22 of the LD portion 14 which is away from the electrode 20, and a polyimide resin 26 for electrically separating the electrodes 20 and 22 are formed on the surface of the ridge waveguide type semiconductor integrated element 10.

Particularly, in the separating portion 18, after a passivation film 28 was formed and before the electrodes are evaporation-deposited, the polyimide resin 26 is formed in such a manner that a concave/convex-shaped groove formed along the waveguide 16 is completely embedded by the polyimide resin 26 and the polyimide resin 26 is extended from one end to the other end of the ridge waveguide type semiconductor integrated element 10.

Therefore, if the electrodes are evaporation-deposited onto the whole surface of a wafer by an EB (Electron Beam) evaporation depositing method or the like after that, in the separating portion 18, the electrodes are formed on the polyimide resin 26 which embeds the concave/convex-shaped groove (refer to FIG. 2A), so that the electrodes are not directly adhered to side walls or bottom corner portions of the waveguide 16. Since the separating portion 18 is covered without a break by the polyimide resin 26 from one end to the other end of the ridge waveguide type semiconductor integrated element 10, new concave/convex portions are not formed by the polyimide resin 26. Therefore, after the polyimide resin 26 was formed, if an electrode layer 21 which has been evaporation-deposited onto the polyimide resin 26 is removed by the dry etching such as an ion milling or the like as electrode removing means having the orientation in a manner similar to that in the related art (refer to FIG. 2B), the electrode 20 of the EA portion 12 and the electrode 22 of the LD portion 14 can be electrically and perfectly separated.

Manufacturing steps of the ridge waveguide type semiconductor integrated element 10 will now be described in detail with reference to FIGS. 3A and 3B to FIGS. 11A and 11B. FIGS. 3A and 3B to FIGS. 11A and 11B show cross sectional structures of the ridge waveguide type semiconductor integrated element 10 taken along the line a-a' and the line b-b' in FIG. 1 in order of the manufacturing steps, respectively.

Figure 3A:
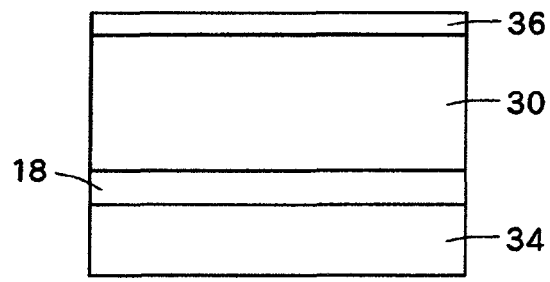
FIG. 3A is a diagram for explaining a manufacturing step (growth of a multilayer) of the ridge waveguide type semiconductor integrated element according to the embodiment of the invention.
Figure 3B:
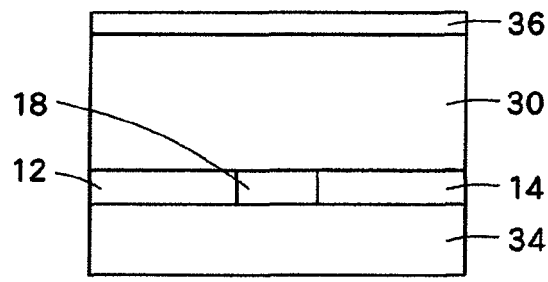
FIG. 3B is a diagram for explaining a manufacturing step (growth of the multilayer) of the ridge waveguide type semiconductor integrated element according to the embodiment of the invention.

First, a multilayer structure comprising a layer including the EA portion 12, separating portion 18, and LD portion 14, an InP clad layer 30, and an InGaAs contact layer 36 is grown onto an InP substrate 34 by an MOCVD (Metal Organic Chemical Vapor Deposition) (FIGS. 3A and 3B). Since the EA portion 12, separating portion 18, and LD portion 14 have different crystalline structures, a crystal growth is performed by using the insulating film as a mask by a butt joint method or a selective growing method.

Figure 4A:
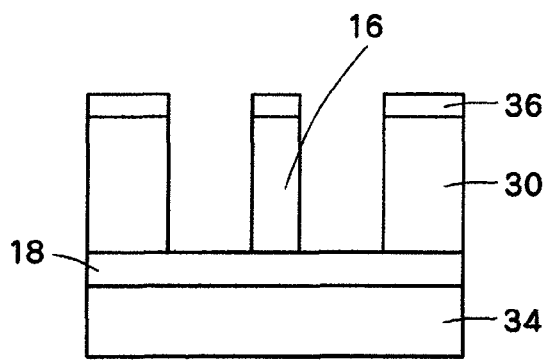
FIG. 4A is a diagram for explaining a manufacturing step (creation of a waveguide) of the ridge waveguide type semiconductor integrated element according to the embodiment of the invention.
Figure 4B:
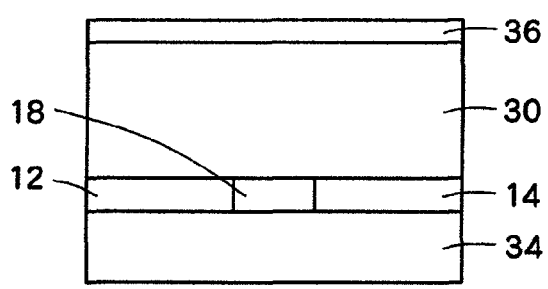
FIG. 4B is a diagram for explaining a manufacturing step (creation of the waveguide) of the ridge waveguide type semiconductor integrated element according to the embodiment of the invention.
Figure 5A:
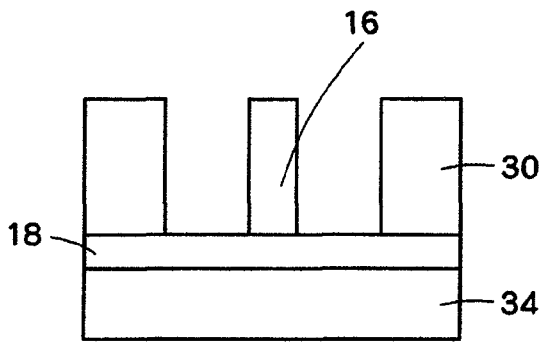
FIG. 5A is a diagram for explaining a manufacturing step (creation of a separating groove) of the ridge waveguide type semiconductor integrated element according to the embodiment of the invention.
Figure 5B:
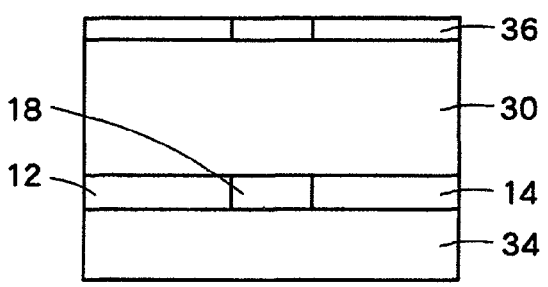
FIG. 5B is a diagram for explaining a manufacturing step (creation of the separating groove) of the ridge waveguide type semiconductor integrated element according to the embodiment of the invention.

Subsequently, the ridge type waveguide 16 is formed in the InP clad layer 30 by lithography and etching (FIGS. 4A and 4B). Further, areas other than the separating portion 18 where no electrodes are formed are covered with a resist and the InGaAs contact layer 36 of the separating portion 18 is removed (FIGS. 5A and 5B). Thus, the InGaAs contact layer 36 of the EA portion 12 and the InGaAs contact layer 36 of the LD portion 14 which have the same electric potentials as those of the electrodes which are formed thereon are electrically separated. After that, areas other than the upper portions of the waveguide 16 of the EA portion 12 and the LD portion 14 on which the electrodes 20 and 22 are formed are protected by the passivation film 28 (for example, $SiO_2$ film) serving as an insulating film (protecting film) (FIGS. 6A and 6B). The passivation film 28 which is formed here has a concave/convex structure along the shapes of the waveguide 16 and the InP clad layers 30 formed on both sides thereof. The processing steps mentioned so far are similar to the manufacturing steps in the related art.

After the passivation film 28 was formed, the whole surface of the wafer is coated with the polyimide resin 26 (FIGS. 7A and 7B). Thus, the concave/convex-shaped grooves formed along the waveguide 16 are embedded by the polyimide resin 26. Subsequently, the polyimide resin 26 is masked by a resist 38 from one end to the other end of the wafer along the separating portion 18 and the polyimide resin 26 in the areas other than the separating portion 18 is removed by the dry etching (FIGS. 8A and 8B). The polyimide resin 26 remaining on the separating portion 18 has a shape which is swollen higher than the InGaAs contact layer 36 and is extended from one end to the other end of the wafer. In the above etching, the polyimide resin 26 may be left up to an inside position of about 5 to 10 µm of the areas where the electrodes 20 and 22 are formed in consideration of aligning precision in the lithography.

Figure 9A:
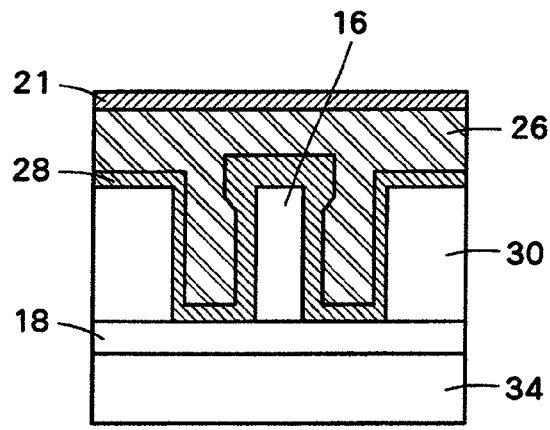
FIG. 9A is a diagram for explaining a manufacturing step (evaporation deposition of an electrode) of the ridge waveguide type semiconductor integrated element according to the embodiment of the invention.
Figure 9B:
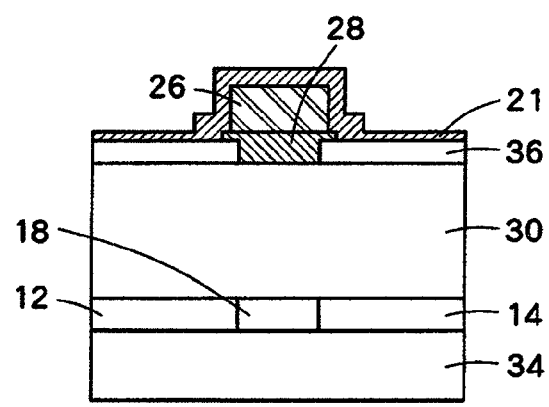
FIG. 9B is a diagram for explaining a manufacturing step (evaporation deposition of the electrode) of the ridge waveguide type semiconductor integrated element according to the embodiment of the invention.
Figure 10A:
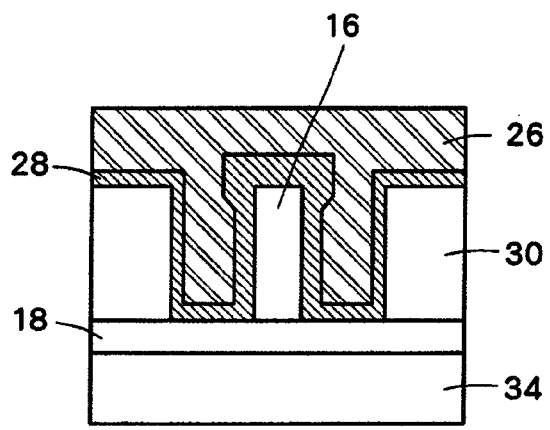
FIG. 10A is a diagram for explaining a manufacturing step (ion milling) of the ridge waveguide type semiconductor integrated element according to the embodiment of the invention.
Figure 10B:
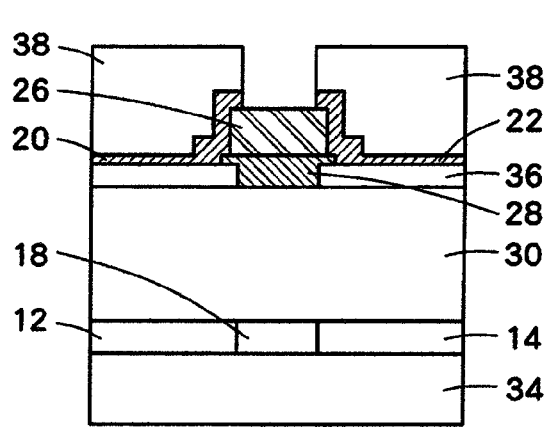
FIG. 10B is a diagram for explaining a manufacturing step (ion milling) of the ridge waveguide type semiconductor integrated element according to the embodiment of the invention.
Figure 11A:
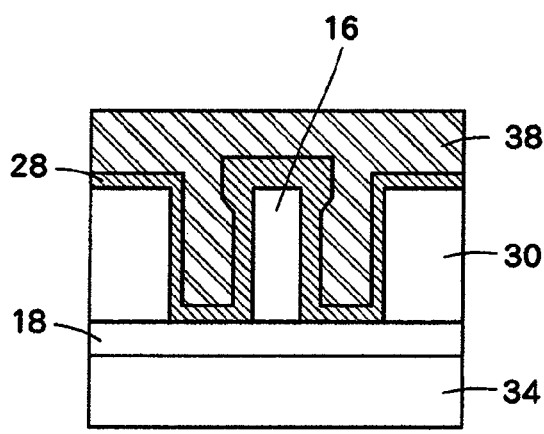
FIG. 11A is a diagram for explaining a manufacturing step (removal of the resist) of the ridge waveguide type semiconductor integrated element according to the embodiment of the invention.
Figure 11B:
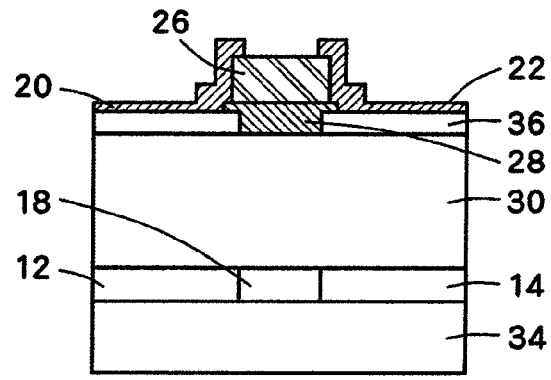
FIG. 11B is a diagram for explaining a manufacturing step (removal of the resist) of the ridge waveguide type semiconductor integrated element according to the embodiment of the invention.
Figure 12:
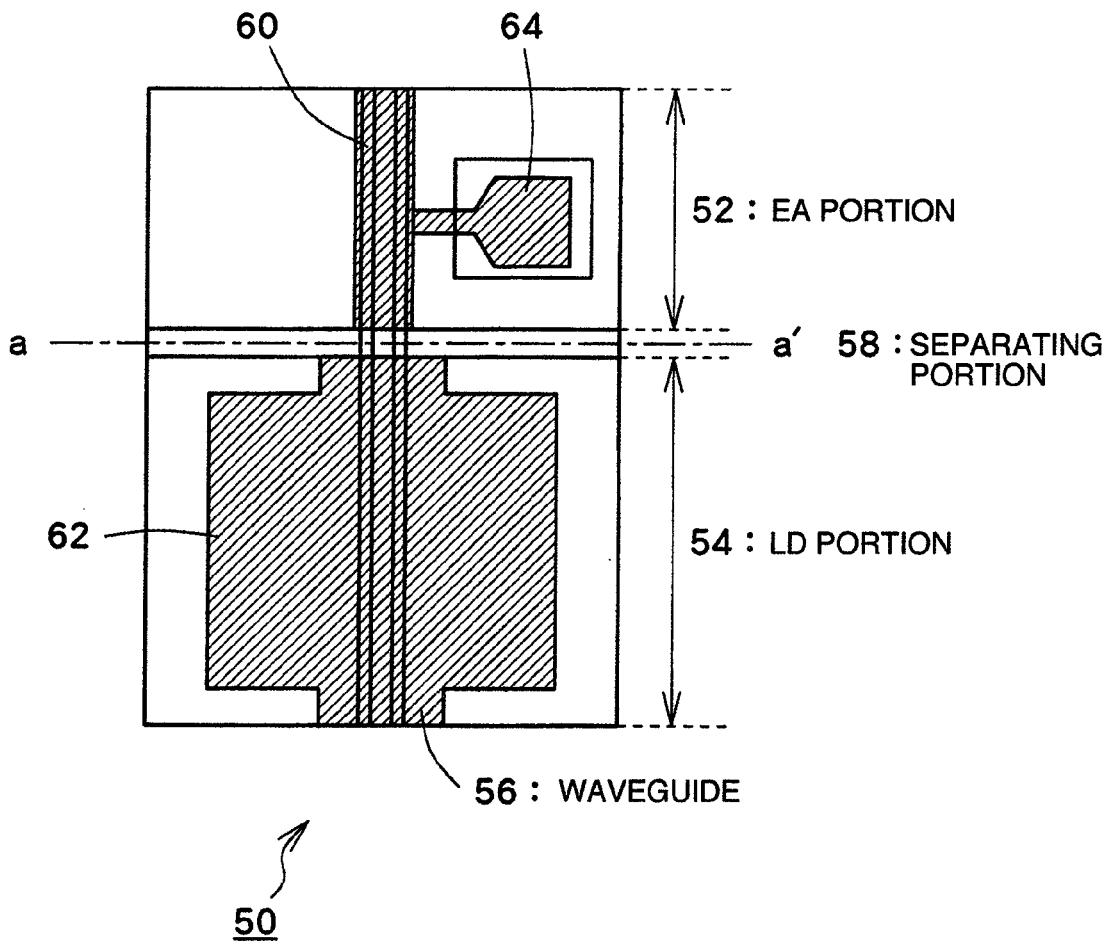
FIG. 12 is a top view of a ridge waveguide type semiconductor integrated element in the related art.
Figure 13A:
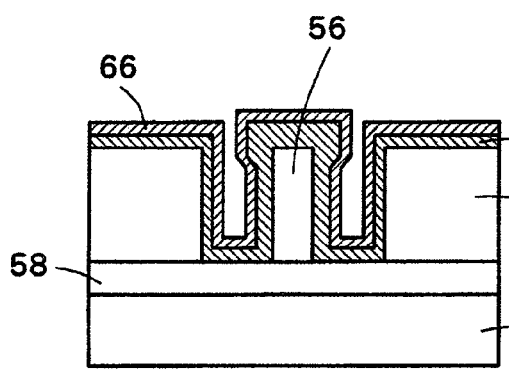
FIG. 13A is a cross sectional view of the ridge waveguide type semiconductor integrated element taken along the line a-a' in FIG. 12.
Figure 13B:
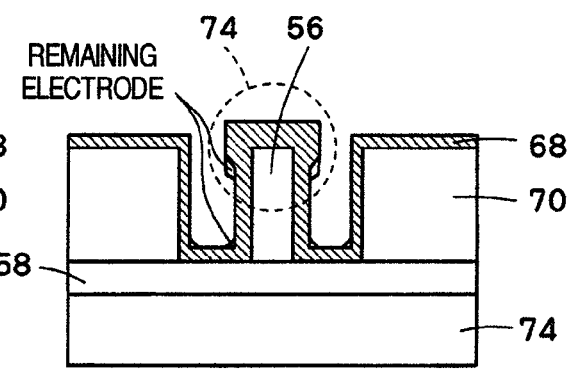
FIG. 13B is a cross sectional view of the ridge waveguide type semiconductor integrated element taken along the line a-a' in FIG. 12.

After the resist 38 was removed, the electrode layer (for example, Au) 21 is formed on the whole wafer surface (it may be at least areas where the electrodes 20 and 22 are formed in the substrate surface whose concave/convex-shaped grooves have been embedded by the polyimide resin 26) by the EB evaporation depositing method or the like (FIGS. 9A and 9B). Subsequently, a part of the InGaAs contact layer 36 of the EA portion 12 where the electrode 20 is formed and a part of the InGaAs contact layer 36 of the LD portion 14 where the electrode 22 is formed are masked by the resist 38 (FIGS. 10A and 10B). The electrode layer 21 formed in the other areas including the separating portion 18 is removed by the ion milling (FIGS. 11A and 11B). Particularly, in the separating portion 18, since the polyimide resin 26 has perfectly embedded the concave/convex-shaped grooves and is extended without a break from one end to the other end of the wafer, the electrode layer 21 does not remain on the side walls or the bottom corner portions of the waveguide 16. That is, since the electrode layer 21 formed on the separating portion 18 is completely removed by the ion milling, the formed electrodes 20 and 22 are electrically and perfectly separated. Further, in the separating portion 18, by the polyimide resin 26 which has embedded the concave/convex-shaped grooves, the passivation film 28 formed in the bottom portion of the waveguide 16 is protected against a destruction caused by the ion milling.

According to the ridge waveguide type semiconductor integrated element 10 and the manufacturing method thereof as described above, since the concave/convex-shaped grooves covered by the passivation film 28 extending from the area whose electric potential is equal to that of the electrode 20 of the EA portion 12 to the area whose electric potential is equal to that of the electrode 22 of the LD portion 14 are embedded by the polyimide resin 26 before the electrode material is evaporation-deposited, the electrode material is not directly evaporation-deposited to the side walls or the bottom corner portions of the waveguide 16. Therefore, the portion which becomes the shadow of the ion milling is not caused between the electrodes 20 and 22. The electrode layer 21 formed in the areas other than the areas which become the electrodes 20 and 22 is perfectly removed by the ion milling. That is, the electrode 20 of the EA portion 12 and the electrode 22 of the LD portion 14 are electrically and perfectly separated.

The invention is not limited to the foregoing embodiment but various modifications are possible. For example, although the invention is applied to the ridge waveguide type semiconductor integrated element in the above explanation, the invention can be also applied to a semiconductor element, as a whole, comprising: two electrodes arranged so as to be away from each other; two bases which are arranged so as to be away from each other and in each of which the electrode is formed on an upper surface and an edge (conductive edge) of at least a part of the upper surface is set to the same electric potential as that of the electrode; and a concave- or convex-shaped concave/convex structure having insulation performance and extending from the conductive edge of one of the two bases to the conductive edge of the other base.

In place of the polyimide resin, another material having the insulation performance may be used. In this case, if possible, it is desirable to use a material having a high survivability against the dry etching such as an ion milling or the like and a low hygroscopicity.

Naturally, shapes and materials of the substrate, electrodes, and other portions constructing the semiconductor element are not limited to those mentioned in the foregoing embodiment. For example, the InGaAs contact layer 36 which is set to the same electric potential as that of the electrode 20 of the EA portion 12 may have a shape smaller than that of the electrode 20 which is formed on the upper surface of the layer 36, or the contact layer of the LD portion can be also made of a material other than InGaAs.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A manufacturing method of a ridge waveguide type semiconductor integrated element having an optical modulator and a laser diode integrated, comprising:
    forming onto a semiconductor substrate a multilayer structure having a layer which includes an optical modulator portion, a laser diode portion and a separating portion for electrically separating said optical modulator portion and said laser diode portion, a clad layer and a contact layer;
    forming onto a substrate a concave- or convex-shaped concave/convex structure including a ridge type optical waveguide which optically connects said optical modulator portion with said laser diode portion;
    embedding said concave/convex structure by an insulating resin, and forming an area in which said separating portion is located on said semiconductor substrate such that said area is swollen higher then said contact layer by said insulating resin; and
    forming electrodes into respective areas on said contact layer of said optical modulator and said laser diode portion where said electrodes are formed onto said substrate in which said concave/convex structure has been embedded by said insulating resin.

2. A manufacturing method of a ridge waveguide type semiconductor integrated element according to claim 1, wherein in the forming said concave/convex structure by said insulating resin, said insulating resin is extended from one end to the other end of said ridge waveguide type semiconductor integrated element between electrodes of said optical modulator portion and said laser diode portion.

* * * * *